United States Patent [19]

Schatz et al.

[11] 4,181,543
[45] Jan. 1, 1980

[54] MAKING A SUPER CONDUCTOR

[75] Inventors: Friedrich Schatz, Langenhagen; Karl-Heinz Marx, Garbsen; Peter Rohner, Isernhagen, all of Fed. Rep. of Germany

[73] Assignee: Kabel- und Metallwerke Gutehoffnungshütte Aktiengesellschaft, Hanover, Fed. Rep. of Germany

[21] Appl. No.: 4,563

[22] Filed: Jan. 18, 1979

[30] Foreign Application Priority Data

Feb. 8, 1978 [DE] Fed. Rep. of Germany ....... 2805307

[51] Int. Cl.² .................. C21D 1/00; H01V 11/00
[52] U.S. Cl. .................... 148/127; 29/599; 148/20.3; 266/250; 266/259; 427/383 D
[58] Field of Search .............. 148/127, 133, 20.3, 148/157; 266/250, 251, 259, 46; 204/38 B; 228/144–147, 200; 29/599, 527.4; 427/349, 350, 374 E, 383 D

[56] References Cited

U.S. PATENT DOCUMENTS

| 3,623,221 | 11/1971 | Morton et al. | 29/599 |
| 3,626,585 | 12/1971 | Hammer et al. | 29/599 |
| 3,644,987 | 2/1972 | Scheffler et al. | 29/599 |
| 3,866,315 | 2/1975 | Ziemek | 204/38 B |
| 3,873,799 | 3/1975 | Scheffler et al. | 29/599 |
| 3,876,473 | 4/1975 | McDougall | 148/127 |
| 4,008,102 | 2/1977 | Muller et al. | 148/133 |
| 4,010,047 | 3/1977 | Frohmader et al. | 148/20.3 |
| 4,050,147 | 9/1977 | Winter et al. | 29/599 |

FOREIGN PATENT DOCUMENTS 2443226 3/1976 Fed. Rep. of Germany ............ 29/599

Primary Examiner—L. Dewayne Rutledge
Assistant Examiner—Peter K. Skiff
Attorney, Agent, or Firm—Smyth, Pavitt, Siegemund, Jones & Martella

[57] ABSTRACT

A super conductor is made by first shaping a copper strip carrying a niobium layer into a corrugated tube; thereafter tin is deposited on the tube which is coiled, hung from a ceramic rod and placed into an annealing furnace being evacuated thereafter, the interior of the tube is sealed off from the interior of the furnace. After, e.g. two hours of heating for causing the tin to diffuse into the niobium, a sufficiently thick layer of $Nb_3Sn$ has developed and a cold inert gas is flushed through the tube to rapidly cool the tube while retaining it in the evacuated but no longer heated furnace.

5 Claims, 3 Drawing Figures

MAKING A SUPER CONDUCTOR

BACKGROUND OF THE INVENTION

The present invention relates to a method for making a super conductor.

Super conductors are made, for example, by first providing a strip or tape serving as a substrate and carrier for a coating of one component for an intermetallic compound. This strip or tape is formed into a tube by progressively longitudinally folding the strip to form a split tube. The longitudinal joint is seam welded, and either before or after welding the tube is coated with the second component for the intermetallic compound. Subsequently, the tube is annealed in vacuum to obtain the intermetallic compound. In order to provide the conductor with enhanced flexibility, the welded tube may be corrugated.

Generally speaking, intermetallic compounds are used frequently as super conductors, because of their rather high transition temperature; cooling is increasingly difficult for temperature close to absolute zero. Several known compounds use niobium as one compound as several niobium compounds have indeed a large transition temperature. For example, $Nb_3Sn$ becomes already super conductive at temperatures below 18° Kelvin, which is a little above 36° Rankine.

An $Nb_3Sn$ super conductor has been made, for example, in the manner outlined above, wherein a copper strip with a niobium coating was formed into a split tube, etc., and the seam welded and corrugated tube was then coated with tin and annealed in vacuum at 950° C. Corrugation has to precede the formation of the compound because $Nb_3Sn$ is very brittle. It must be mentioned, however, that such a conductor has been made only more or less on an experimental basis and in relatively short lengths. Difficulties were encountered in production engineering when conductors of several hundred yards were to be made. The problems centered about the high vacuum annealing, whereby diffusion into the outer surface strata has to be avoided. Moreover, it is required to quench cool the product, still under exclusion of ambient air. Flooding the process chamber, e.g. with argon, was found to be insufficient. For a description of this process see German printed patent application No. 2,443,226.

DESCRIPTION OF THE INVENTION

It is an object of the present invention to provide a new and improved method of making a stabilized super conductor of large length and in an economical manner.

It is a specific object of the present invention to improve a method of making a super conductor in which a metal strip carrying one component for an intermetallic compound is formed into a split tube and seam welded and in which before or after the welding the second component is deposited on the first one and in which subsequently one of the components is caused thermally to diffuse into the other one.

In accordance with the preferred embodiment of the present invention, it is suggested to improve the method as per the specific object, by sealing the interior of the tube off from the interior of an evacuated heating furnace in which the tube is placed, preferably in a coiled configuration being suspended from a non-metallic rod. The tube is then heated to obtain diffusion of the two components for forming an intermetallic compound. Subsequently, a cooling medium is flushed through the tube which is still retained in the evacuated but no longer heated furnace chamber. The cooling medium should be an inert gas so that the metal surface of the interior of the tube does not corrode nor must it be otherwise chemically attacked. The cooled conductor can now be removed and processed further. Processing, storing or other handling may be facilitated if the tube was corrugated prior to the depositing of the second component. Application to a copper tube and formation of a $Nb_3Sn$ conductive layer is particularly recommended.

DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

Figure 1:
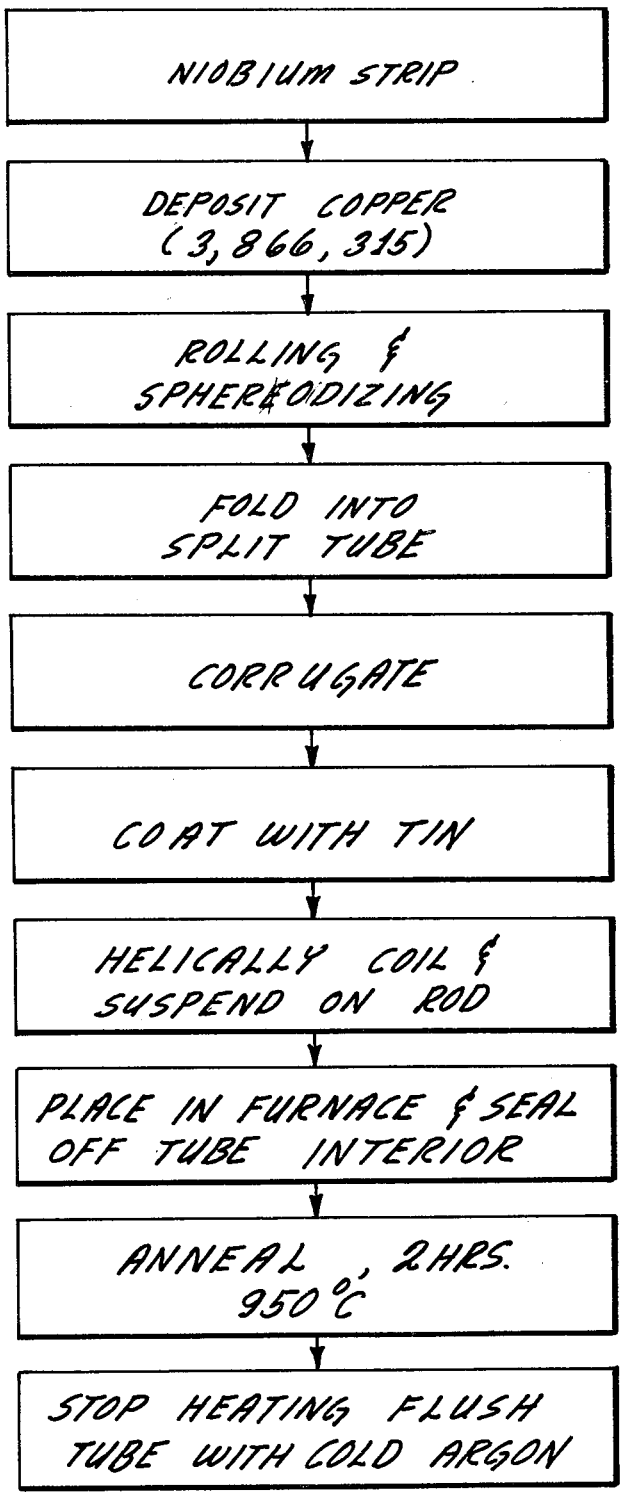
FIG. 1 is a flow chart of the process for making a super conductor as improved in accordance with the preferred embodiment of the invention.

Proceeding now to the detailed description of the drawings, the process begins with making a tape or strip in a manner as described in U.S. Pat. No. 3,866,315. Briefly, a thin niobium tape is treated by brushing on copper and subsequently depositing thereon copper by an electroplating process. The copper layer will be quite thick, so that finally the product is a copper strip with a niobium coating or plating. The copper strip so made is rolled for stretching it and annealed to eliminate hardening that resulted from the cold rolling.

Next, the tape or strip so made is fed to a machine which longitudinally folds the strip into a split tube, and the adjoining edges are welded by means of electrical arc welding. The strip is folded so that the niobium layer remains on the outside. Next, the resulting tube is corrugated.

After the tube has been made flexible by means of the corrugation, it is, e.g. dipped into tin bath to coat a tin layer on top of the niobium layer. The tube 1 as so made is helically coiled and hung on a rod 2 (FIG. 2) made of a ceramic material. The individual loops must not touch.

The thus suspended tube is now placed into a furnace chamber 3 in that the ends of rod 2 are received in suitable holders 4. The two ends 5 and 6 of the tube are run out of the chamber but the respective openings are sealed by suitable plugs 7 and 8 so that the interior of the furnace is vacuum-tightly closed. Most importantly, the interior of the tube is sealed off from the interior of the furnace.

One end, e.g. end 6 of the tube, is next connected to a blower or fan which, however, is not yet used. Independently from this connection, furnace chamber 3 is evacuated to a pressure of $10^{-4}$ Torr. Subsequently, the interior of the chamber is heated by radiation to about 950° C., and/or by passing a heating fluid through the tube. Heating lasts for about 2 hours so that sufficient quantities of tin diffuse into the niobium to establish the inter metallic compound $Nb_3Sn$. The purpose of using a ceramic rod and of spacing the loops of the coil carefully, is to make sure that the tube will not be soldered to any support nor must the loops be soldered to each other.

After about 2 hours, heating is discontinued and a protective inert gas, for example, argon, is blown by the blower 9 into and through tue tube 1 to rapidly cool it as much and as fast as possible. The good thermal conduction properties of copper are quite instrumental for obtaining fast cooling. The flow speed should be such that the tube cools at several degrees per second.

After the tube 1 has been cooled in that fashion, the furnace is opened to expose the exterior of tube 1 to the outer atmosphere.

Figure 2:
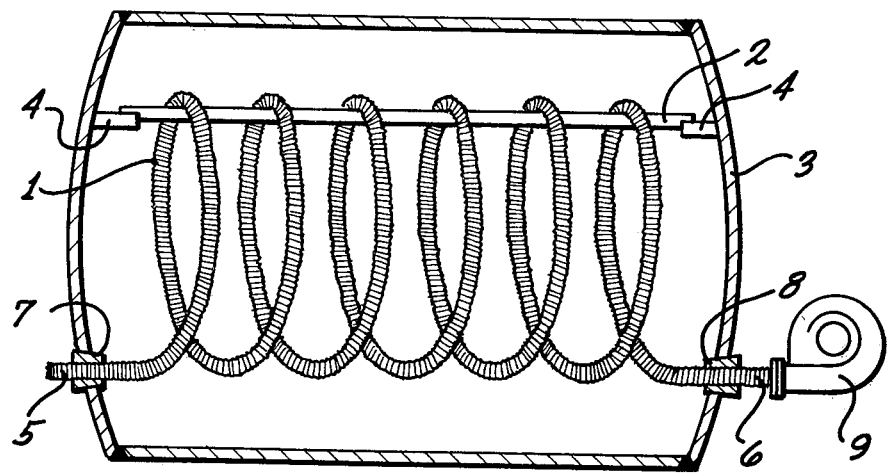
FIG. 2 is a cross-section through a processing chamber for practicing the preferred embodiment.

The apparatus is shown in FIG. 2 schematically only. In practice, it may not be practical to run the tube ends through the furnace wall in each instance and to re-seal the openings. Rather, the end walls of the furnace may be provided with feed tubes to which the ends of the tube 1 are connected.

Figure 3:
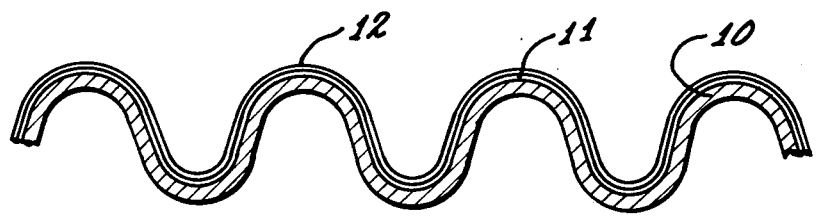
FIG. 3 is a cross-section through a conductor made by the process.

FIG. 3 shows a cross-section through the tube 1, just prior to annealing. The bulk of the tube's wall is made of copper 10 with a niobium layer 11 firmly adhering thereto. A tin layer 12 has been deposited upon the niobium. At 950° C. tin readily diffuses into the niobium, undisturbed by any external impurities.

The primary advantage of the method is to be seen in the fact that the conductor structure has been completed prior to generating the $Nb_3Sn$ layer in situ. That layer is rather brittle, and its contour as it comes into being is that of a corrugated tubular structure without having to undergo any bending etc., that results in such a contour. The resulting conductor can be readily reeled on drums as bending the corrugated tube produces locally very little stress in the super conductor and will not damage it.

The invention is not limited to the embodiments described above but all changes and modifications thereof not constituting departures from the spirit and scope of the invention are intended to be included.

We claim:

1. A method for making a super conductor by using a metallic strip as a carrier with a coating of a first component, forming the strip into a split tube, the coating being on the outside, and seam welding its edges, depositing before or after welding a second component onto the first compound, the improvement comprising in combination:

annealing the tube in vacuum so that one of the two components diffuses into the respective other one to form an intermetallic compound;

separating the interior of the tube from the vacuum; and flushing a cooling medium through the interior of the tube after the annealing, while the tube is still maintained in the vacuum, to rapidly cool the tube.

2. The method as in claim 1, using an inert gas for flushing.

3. The method as in claim 1, under utilization of a furnace and including the step of placing the tube into the furnace, the separating step including sealing the interior of the tube from the interior of the furnace.

4. The method as in claim 3, and including the step of coiling the tube helically and suspending the resulting helical coil on a non-metallic rod in the furnace for annealing.

5. The method as in claim 1, wherein the strip is of copper, the first component being niobium, the second component being tin.

* * * * *